(12) United States Patent
Juds et al.

(10) Patent No.: US 9,088,209 B2
(45) Date of Patent: Jul. 21, 2015

(54) PARASITIC POWER SUPPLY AND SENSOR APPARATUS INCLUDING A POWER SUPPLY

(75) Inventors: Mark A. Juds, New Berlin, WI (US);
Edward T. Gisske, Mount Horeb, WI (US); Naresh K. Kodela, Maharashtra (IN); Xin Zhou, Franklin Park, PA (US); Jayasuriya R, Maharashtra (IN)

(73) Assignee: EATON CORPORATION, Cleveland, OH (US)

( * ) Notice: Subject to any disclaimer, the term of this patent is extended or adjusted under 35 U.S.C. 154(b) by 617 days.

(21) Appl. No.: 13/109,162

(22) Filed: May 17, 2011

(65) Prior Publication Data

US 2012/0294043 A1 Nov. 22, 2012

(51) Int. Cl.
*H02M 3/26* (2006.01)
*H02M 3/156* (2006.01)
*G01R 31/40* (2014.01)

(52) U.S. Cl.
CPC .............. *H02M 3/156* (2013.01); *G01R 31/40* (2013.01)

(58) Field of Classification Search
CPC ....... H02M 3/26; H02M 3/156; H02M 3/158; G01R 31/40; G05F 1/20; G05F 1/14; G05F 1/561; Y02B 70/126
USPC ............ 323/305, 301, 328, 288, 326; 363/15, 363/19, 73, 89, 125, 127, 17
See application file for complete search history.

(56) References Cited

U.S. PATENT DOCUMENTS

| 6,222,743 | B1 * | 4/2001 | Meyer | 363/41 |
| 7,042,161 | B1 * | 5/2006 | Konopka | 315/119 |
| 7,145,322 | B2 | 12/2006 | Solveson et al. | |
| 7,253,602 | B2 | 8/2007 | Shvach et al. | |
| 7,280,338 | B2 | 10/2007 | Juds et al. | |
| 8,237,419 | B2 * | 8/2012 | Schroeder et al. | 323/277 |
| 2003/0015972 | A1 * | 1/2003 | Suzuki | 315/291 |
| 2008/0246507 | A1 * | 10/2008 | Gunn et al. | 324/771 |
| 2009/0009098 | A1 * | 1/2009 | Nukisato et al. | 315/223 |
| 2009/0200270 | A1 | 8/2009 | Chen et al. | |
| 2010/0039083 | A1 * | 2/2010 | Moriarty, Jr. | 323/282 |
| 2010/0164650 | A1 * | 7/2010 | Abou-Alfotouh et al. | 333/181 |
| 2010/0264906 | A1 | 10/2010 | Shamir et al. | |

FOREIGN PATENT DOCUMENTS

| JP | 2002 131344 A | 5/2002 |
| JP | 2010 066145 A | 3/2010 |
| WO | 2010/119353 A1 | 10/2010 |

OTHER PUBLICATIONS

European Patent Office, "International Search Report and Written Opinion", 9 pp., Oct. 26, 2012.

* cited by examiner

*Primary Examiner* — Jessica Han
*Assistant Examiner* — Gustavo Rosario Benitez
(74) *Attorney, Agent, or Firm* — Eckert Seamans Cherin & Mellott, LLC; Kirk D. Houser; Philip E. Levy (57) ABSTRACT

A parasitic power supply derives power from its proximity to an electrical power conductor. The power supply includes a transformer having a coil disposed on a core structured to be disposed parallel to the power conductor. The coil has a voltage induced by current flowing in the power conductor. A voltage regulating circuit cooperates with the transformer and includes a capacitor having a voltage, a charge switch structured to charge the capacitor from the coil voltage, a bootstrap circuit structured to enable the charge switch to charge the capacitor when the capacitor voltage is below a first predetermined value, a charge controller structured to enable the charge switch to charge the capacitor when the capacitor voltage is below a second predetermined value, and a voltage regulator powered by the capacitor voltage.

21 Claims, 8 Drawing Sheets

PARASITIC POWER SUPPLY AND SENSOR APPARATUS INCLUDING A POWER SUPPLY

BACKGROUND

1. Field

The disclosed concept pertains generally to power supplies and, more particularly, to parasitic power supplies for electrical distribution systems. The disclosed concept also pertains to sensor apparatus for electrical distribution systems.

2. Background Information

U.S. Pat. Nos. 7,145,322 and 7,253,602 disclose a power supply employing voltage produced by magnetically coupling a power bus to one or more coils, in order to power sensors and other circuitry from flux arising from current flowing in the power bus. A housing is coupled to a current carrying power bus, such as a power bus bar. The power supply includes two power coils each of which has an opening, a ferrite core having two ends, and a magnetic flux concentrator member having two ends. The ferrite core passes through the openings of the power coils. The ends of the magnetic flux concentrator member engage the respective ends of the ferrite core. The ferrite core and the magnetic flux concentrator member encircle and capture the power bus bar. The ferrite core and the magnetic flux concentrator member further combine to act as a flux concentrator and, also, hold a sensor device to the power bus bar. The sensor device uses the two flux sensing power coils and the common inserted ferrite core for improved magnetic flux coupling to convert the magnetic flux from the power bus bar to a usable voltage source to provide suitable input power for the power supply. As a result, the sensor device is self-powered.

U.S. Pat. No. 7,253,602 also discloses a power supply including a coil having an output with an alternating current voltage, a voltage multiplier circuit, such as a voltage doubler circuit, having an input electrically interconnected with the coil output and an output with a direct current voltage, and a voltage regulator having at least one output with the at least one voltage. The power supply voltage regulator includes a circuit adapted to monitor the direct current voltage and disable a voltage regulator circuit when the direct current voltage is below a predetermined value (e.g., without limitation, 3.5 VDC). Otherwise, the enable input of the voltage regulator circuit is pulled low to enable the same to source the voltage.

There is room for improvement in parasitic power supplies for an electrical power conductor.

There is also room for improvement in sensor apparatus for an electrical power conductor.

SUMMARY

These needs and others are met by embodiments of the disclosed concept, which employ a transformer comprising a coil disposed on a core structured to be disposed parallel to an electrical power conductor, the coil having a voltage induced by current flowing in the electrical power conductor; and a voltage regulating circuit cooperating with the transformer, the voltage regulating circuit comprising: a capacitor having a voltage, a charge switch structured to charge the capacitor from the voltage of the coil, a bootstrap circuit structured to enable the charge switch to charge the capacitor when the voltage of the capacitor is below a first predetermined value, a charge controller structured to enable the charge switch to charge the capacitor when the voltage of the capacitor is below a second predetermined value, and a voltage regulator powered by the voltage of the capacitor.

In accordance with one aspect of the disclosed concept, a parasitic power supply is for an electrical power conductor. The power supply comprises: a transformer comprising a coil disposed on a core structured to be disposed parallel to the electrical power conductor, the coil having a voltage induced by current flowing in the electrical power conductor; and a voltage regulating circuit cooperating with the transformer, the voltage regulating circuit comprising: a capacitor having a voltage, a charge switch structured to charge the capacitor from the voltage of the coil, a bootstrap circuit structured to enable the charge switch to charge the capacitor when the voltage of the capacitor is below a first predetermined value, a charge controller structured to enable the charge switch to charge the capacitor when the voltage of the capacitor is below a second predetermined value, and a voltage regulator powered by the voltage of the capacitor.

Each of the charge switch, the bootstrap circuit and the charge controller may either be on or off.

The coil and the capacitor may form an inductor-capacitor filter network for the voltage regulator.

The charge controller may comprise a transistor and a resistor providing hysteresis of the charge switch.

The core may be transverse to the current flowing in the electrical power conductor, be made from a magnetic low carbon electrical steel or a nickel steel, have a central region and a width about equal to or less than a width of the electrical power conductor, and have ends extended in the direction of the current to facilitate collection of magnetic flux; and the coil may be wound onto the central region of the core.

The core may have ends bent toward the electrical power conductor to facilitate collection of magnetic flux.

The core may have ends bent toward and extending beyond the electrical power conductor to facilitate collection of magnetic flux.

The core may have ends bent toward the electrical power conductor to facilitate collection of magnetic flux; and a portion of the ends may also extend away from the electrical power conductor.

A first portion of a first one of the ends may also extend inward toward a second portion of a second one of the ends; and the second portion of the second one of the ends may also extend inward toward the first portion.

A portion of the core may be wrapped around the electrical power conductor.

The core may comprise a layer of core material wrapped around the electrical power conductor a plurality of times.

The electrical power conductor may have a length; the core may comprise two elongated parallel members disposed along the length of the electrical power conductor and a cross member disposed normal to the two elongated parallel members; and the coil may be wound about the cross member.

The core may comprise a first winding and a separate and distinct second winding; the first winding may be electrically interconnected with the voltage regulating circuit; and the second winding may be electrically connected to a capacitor to form a resonant tank circuit, which is structured to resonate at a frequency of the current flowing in the electrical power conductor.

As another aspect of the disclosed concept, a sensor apparatus comprises: a housing; a clamp or a fastener structured to clamp or fasten together the housing and an electrical power conductor; a power supply comprising: a transformer comprising a coil disposed on a core disposed parallel to the electrical power conductor, the coil having a voltage induced by current flowing in the electrical power conductor, and a voltage regulating circuit cooperating with the transformer, the voltage regulating circuit comprising: a capacitor having a voltage, a charge switch structured to charge the capacitor from the voltage of the coil, a bootstrap circuit structured to enable the charge switch to charge the capacitor when the voltage of the capacitor is below a first predetermined value, a charge controller structured to enable the charge switch when the voltage of the capacitor is below a second predetermined value, and a voltage regulator powered by the voltage of the capacitor, a sensor structured to sense a characteristic of the electrical power conductor and output a signal; and a circuit powered by the power supply and structured to output information related to the sensed characteristic from the signal.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the term "acoustic" shall mean one or more sounds that are subsonic, sonic and/or ultrasonic.

As employed herein, the term "electrical power conductor" shall mean a wire (e.g., solid; stranded; insulated; non-insulated), a copper conductor, an aluminum conductor, a suitable metal conductor, an electrical bus bar, a power bus bar, a power bus, or other suitable material or object that permits an electric current to flow easily.

As employed herein, the term "electrical joint" shall mean a structure that electrically and mechanically connects a plurality of electrical conductors.

As employed herein, the term "lug" shall mean a terminal or other electrically conductive fitting to which one or more electrical conductors are electrically and mechanically connected.

As employed herein, the term "electrical conductivity fault" shall mean an arc fault, an electrical discharge breakdown, or a loose or other intermittent electrical connection of an electrical conductor, an electrical joint and/or a lug that leads to a glowing contact.

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

As employed herein, the term "signature" shall mean something that serves to set apart or identify another thing. For example, an acoustic signature serves to set apart or identify an electrical conductivity fault.

As employed herein, the term "fastener" shall mean rivets, adhesives, screws, bolts and the combinations of bolts and nuts (e.g., without limitation, lock nuts) and bolts, washers and nuts.

As employed herein, the term "bolt" shall mean a device or apparatus structured to bolt two or more parts together so as to hold them firmly, such as by bolting an electrical power conductor and a housing including an insulation spacer. A bolt can be, for example, a metal rod or pin for fastening objects together that usually has a head at one end and a screw thread at the other end and is secured by a nut.

As employed herein, the term "clamp" shall mean a device or apparatus structured to bind or constrict or to press two or more parts together so as to hold them firmly, such as by holding or compressing an electrical power conductor and an insulation spacer. The term "clamp" expressly excludes a fastener.

As employed herein, the term "SuperCap" or "supercapacitor" shall mean an electric double-layer capacitor (EDLC), a supercondenser, a pseudocapacitor, an electrochemical double layer capacitor, an ultracapacitor, or another electrochemical capacitor with relatively high energy density as compared to a conventional electrolytic capacitor.

The disclosed concept is described in association with an example acoustic sensor, although the disclosed concept is applicable to a wide range of sensors (e.g., without limitation, a temperature sensor; a pressure sensor; a current sensor; a voltage sensor; another powered sensor or other sensing device) and other applications, such as, for example and without limitation, trip units and overload units, that need electrical power to energize their electronic circuits.

Referring to FIGS. 1A-1C and 11A-11B, a transformer 2, an electrical power conductor, such as a bus bar 4, and a voltage regulating circuit 6 (FIGS. 11A-11B) are shown. The transformer 2 and the voltage regulating circuit 6 cooperatively form a parasitic power supply 8 for use in connection with the bus bar 4 and for deriving power from its proximity thereto. The transformer 2 includes a coil 10 disposed on a core 12 structured to be disposed parallel to the bus bar 4. The coil 10 has a voltage induced by current 14 flowing in the bus bar 4. The voltage regulating circuit 6 cooperates with the transformer 2 and includes a capacitor 16 having a voltage 18, a charge switch 20 structured to charge the capacitor 16 from the rectified voltage of the coil 10, a bootstrap circuit 22 structured to enable the charge switch 20 to charge the capacitor 16 when the capacitor voltage 18 is below a first predetermined value (e.g., without limitation, about 2.1 VDC), a charge controller 24 structured to enable the charge switch 20 to charge the capacitor 16 when the capacitor voltage 18 is below a second predetermined value (e.g., without limitation, about 1.8 VDC), and a voltage regulator 26 powered by the capacitor voltage 18. The bootstrap circuit 22 enables the charge switch 20 to charge the capacitor 16 when the capacitor voltage 18 is below a smaller third predetermined value (e.g., without limitation, about 0.8 VDC). The charge controller 24 disables the bootstrap circuit 22 when the capacitor voltage 18 is greater than about the smaller third predetermined value. The example switching type boost voltage regulator 26 steps up the voltage 18, when it exceeds the smaller third predetermined value, to the desired voltage 88 (e.g., without limitation, about 3.6 VDC).

The disclosed power supply 8 provides power to a sensor 28 (FIG. 12) and/or a corresponding electronic circuit 30 (FIG. 12) thereof without using a direct electrical connection to a power source (not shown, but which energizes the example bus bar 4). The power supply 8 provides sufficient power at relatively low electrical power conductor currents without producing damaging relatively high voltage outputs and voltage spikes in response to relatively high electrical power conductor currents, overload currents and short circuit currents.

The transformer 2 produces power by collecting magnetic flux 32 (FIG. 1C) produced by relatively very low current 14 flowing in the bus bar 4. The electronic voltage regulating circuit 6 operates over a relatively wide range of bus bar current levels and prevents relatively high voltage outputs (e.g., without limitation, generated by the open circuit transformer 2 during relatively high bus bar currents).

Figure 1A:
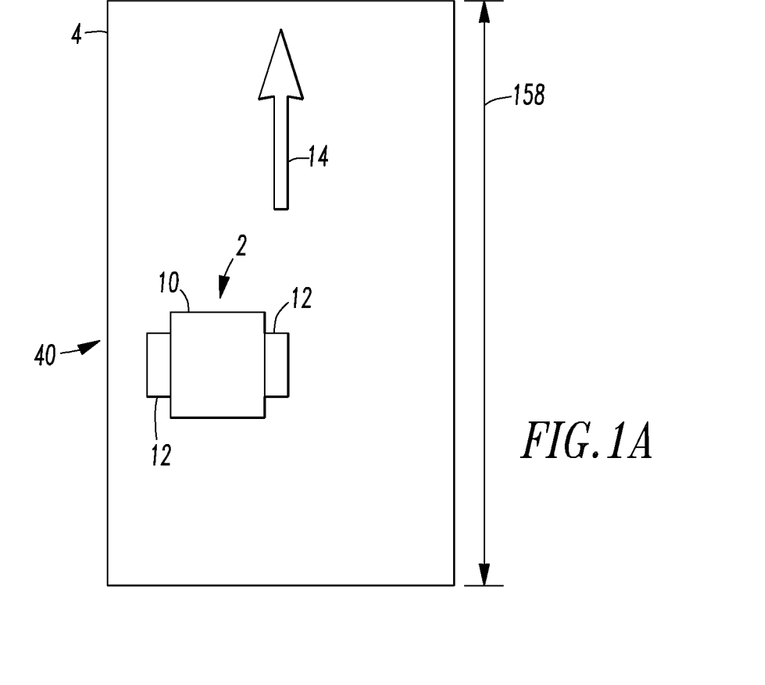
FIG. 1A is a plan view of a transformer and a bus bar in accordance with embodiments of the disclosed concept.
Figure 1B:
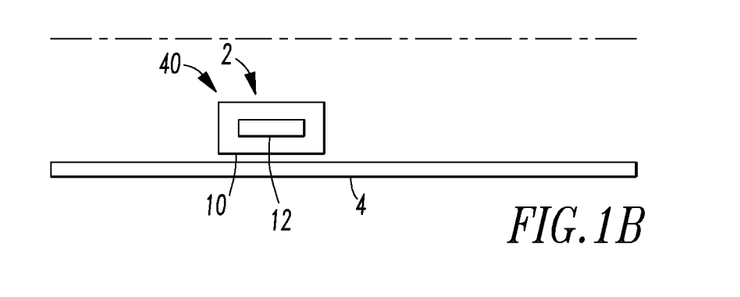
FIG. 1B is a vertical elevation view of the transformer and bus bar of FIG. 1A.
Figure 1C:
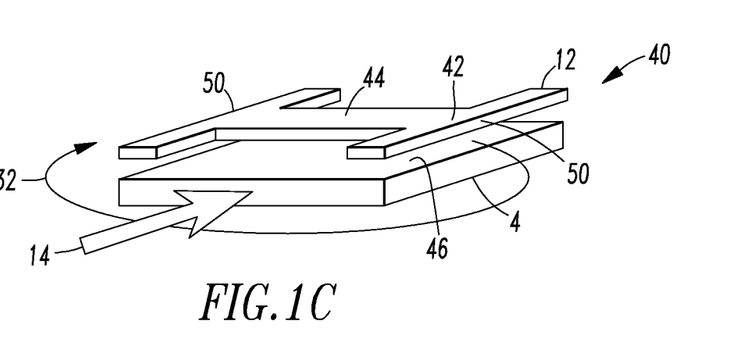
FIG. 1C is an isometric view of the bus bar and the core of the transformer of FIG. 1A.
Figure 12:
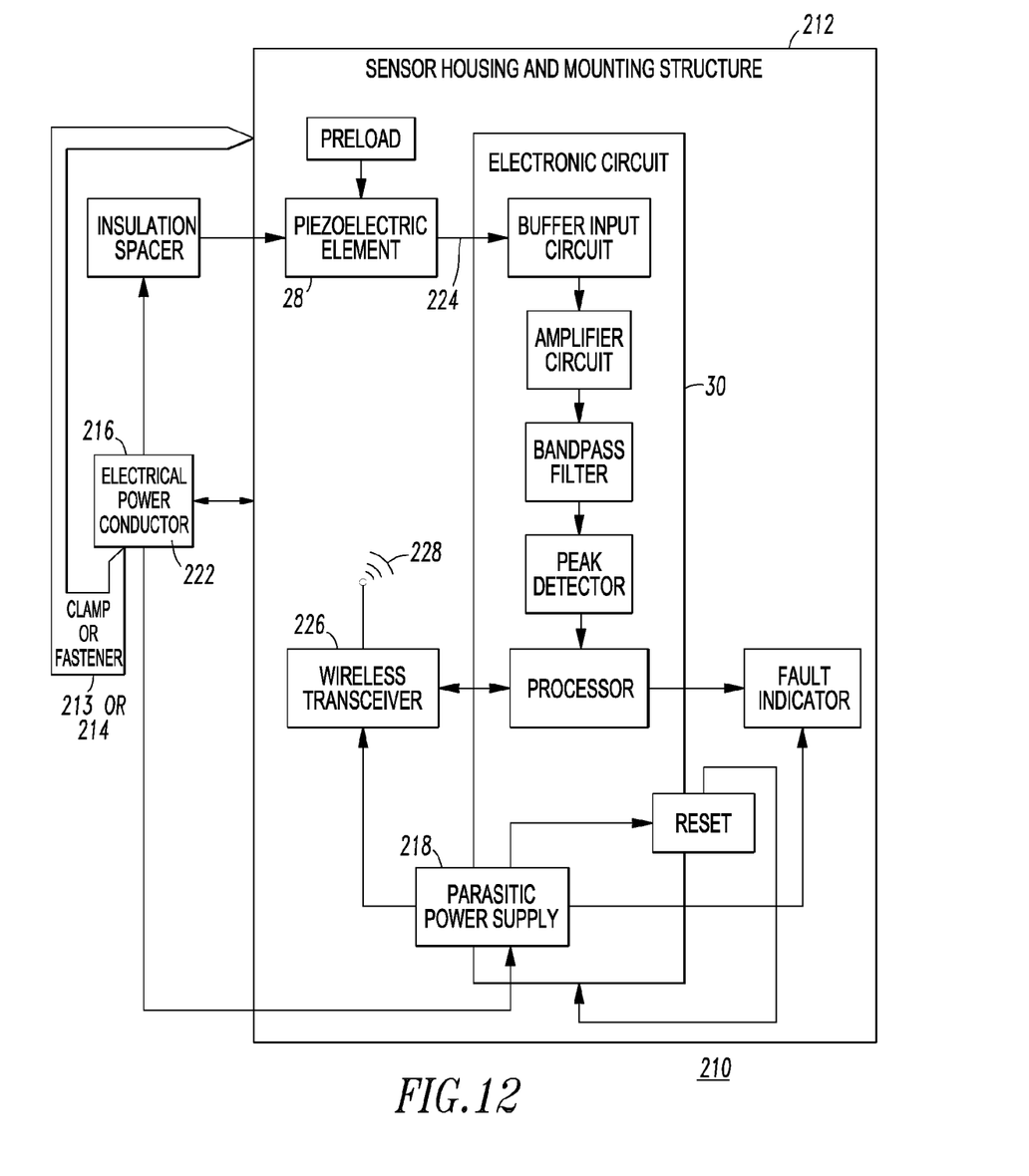
FIG. 12 is a block diagram in schematic form of a sensor apparatus in accordance with another embodiment of the disclosed concept.

A first core configuration 40 is shown in FIGS. 1A-1C. The transformer 2 includes the coil 10 and a relatively soft magnetic core material 42. The core 12 is parallel to the surface of the bus bar 4, and transverse to the bus bar current 14 (FIGS. 1A and 1C), which is in line with the magnetic flux 32. Note that the magnetic flux 32 circulates around the current 14 in the bus bar 4, and the central region 44 of the core 12 is in line with the magnetic flux. Therefore, the core 12 is transverse to the bus bar 4 and to the bus bar current 14. The coil 10 (FIGS. 1A and 1B) is wound onto the central region 44 of the core 12. The transformer 2 provides sufficient power with relatively very low bus bar currents to supply the sensor 28 (FIG. 12) and/or the corresponding electronic circuit 30 (FIG. 12).

The core 12 is made, for example, from a relatively soft magnetic low carbon electrical steel (e.g., without limitation, M-22 or M-5) or a relatively high nickel steel (e.g., without limitation, Hiperm-49 or HyMu-80). The example core 12 is a flat magnetic core, with a width about equal to or less than the width of the bus bar 4 and parallel to the surface 46 thereof. The relatively narrow central region 44 of the core 12 is transverse to the bus bar current 14. The coil 10 is wound onto the relatively narrow central region 44. The relatively wide ends 50 of the core 12 are extended in the direction of the bus bar current 14 to facilitate the collection of the magnetic flux 32. Increased magnetic flux 32 in the core 12 causes increased power output from the coil 10.

Figure 11A:
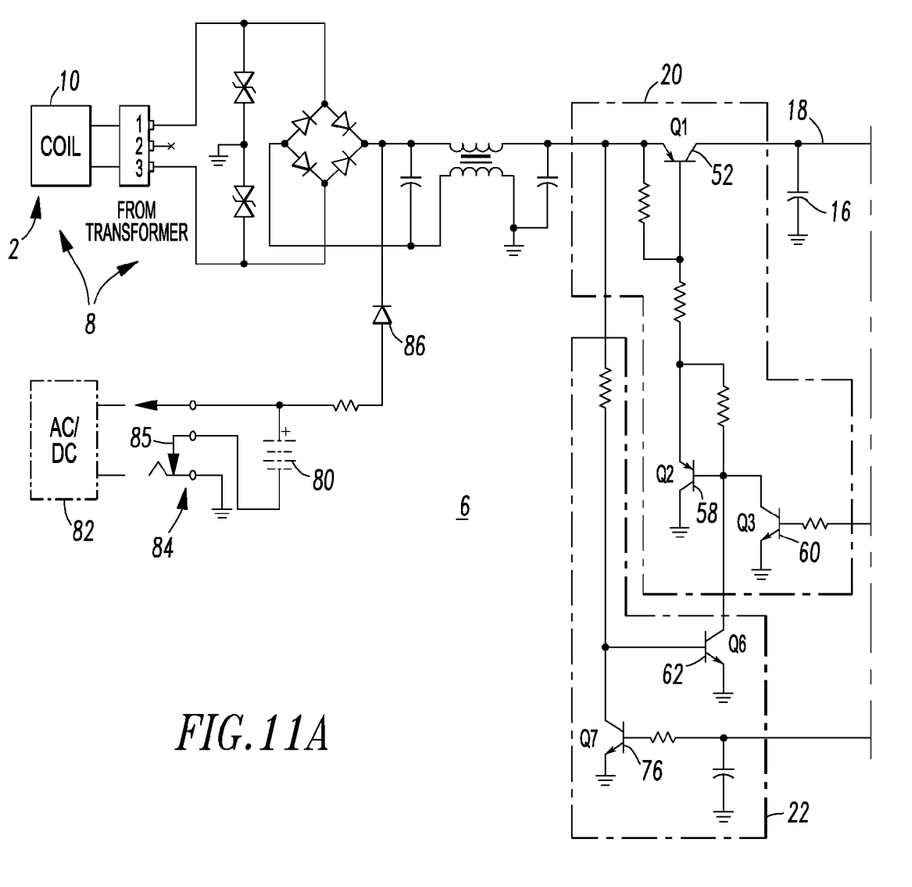
FIGS. 11A-11B form a block diagram in schematic form of a voltage regulating circuit in accordance with another embodiment of the disclosed concept.
Figure 11B:
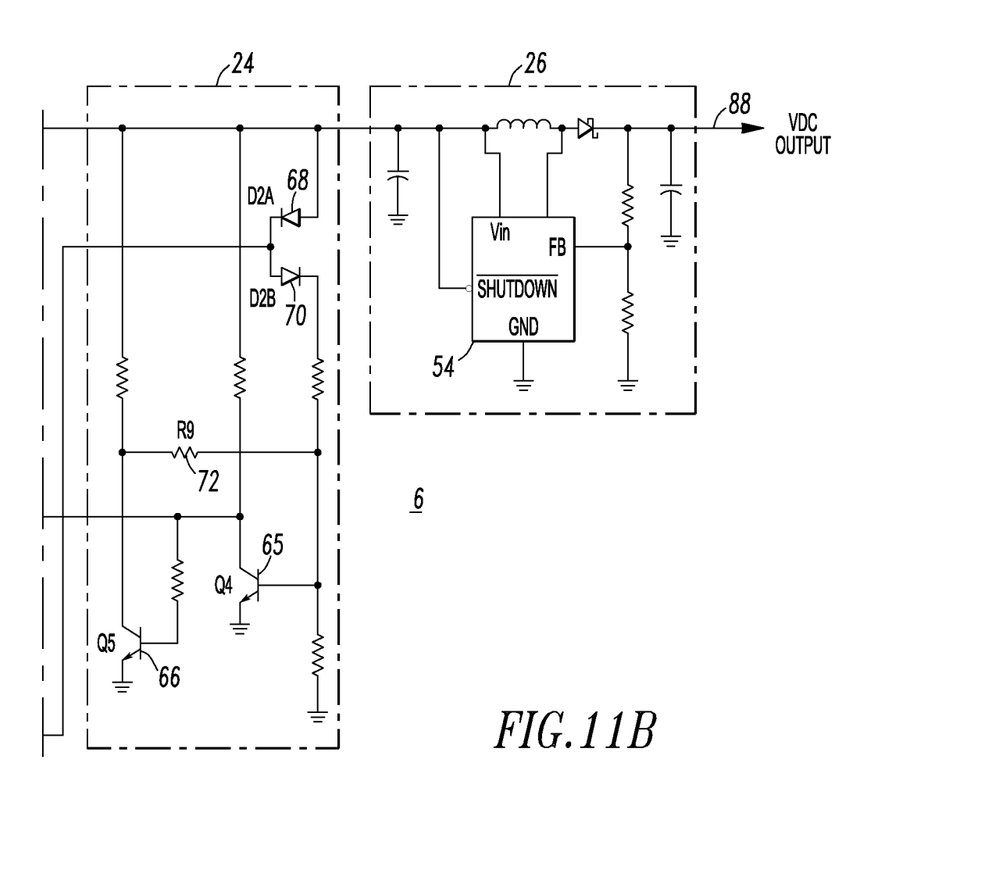

FIGS. 11A-11B show the voltage regulating circuit 6. All of the circuitry beginning at transistor Q1 52 and before the boost switching regulator 54 is intended to be either on or off. The charge switch 20, which is formed by transistors Q1 52, Q2 58, Q3 60, is a simple on-off switch with suitable level-shifting and polarity inversion and is turned on with a suitably low voltage at the base of transistor Q3 60. Transistors Q1 52, Q2 58, Q3 60 and Q6 62 stand off the full voltage of the transformer 2 up to the threshold of their TVS protection diodes (not shown).

The charge controller 24, which is formed by transistors Q4 65, Q5 66 in conjunction with diodes D2A 68, D2B 70, form a voltage sensitive switch that turns on, for example and without limitation, when the voltage 18 is below 1.8 VDC, to turn on drive current to the charge switch transistor Q1 52.

Absent bootstrap circuit 22, which is formed by transistors Q6 62, Q7 76, the charge switch 20 will remain off when the voltage regulating circuit 6 is first powered-on since there is no drive current for transistor Q3 60 until the circuitry downstream of the charge switch 20 builds suitable voltage. Transistor Q6 62 turns on the charge switch 20 until the output voltage 18 at capacitor 16 exceeds about 0.8 VDC. At that time, the bootstrap circuit 22 is locked out and the charge controller 24 takes over.

The storage capacitor 16 and the boost switching regulator 54 smooth out voltage ripple and cooperatively supply, for example and without limitation, a clean 3.6 VDC to the sensor 28 (FIG. 12) and/or the corresponding electronic circuit 30 (FIG. 12). The input voltage to the regulator 54 is a relatively slow asymmetric triangle wave centered, for example and without limitation, around 2.0 VDC with an amplitude determined by the hysteresis in the charge controller 24. The up-slope is a function of how much charging current is available from the transformer 2. The down-slope is a function of how much current is drawn by the sensor 28 and/or the corresponding electronic circuit 30. Transistor Q5 66, via resistor R9 72, supplies some hysteresis to ensure a suitable "snap" action of the charge switch 20 to avoid oscillations around the cut-in point.

The voltage regulating circuit 6 has relatively low power dissipation since all the components, with the exception of the diodes D2A 68, D2B 70, are either on or off. Minimal transformer energy is dissipated by this circuit.

The transformer peak open circuit voltage is, for example and without limitation, at least about 5 VDC at minimum bus current. The capacitor 16, which is preferably a SuperCap, has, for example and without limitation, about 2.1 VDC across it when fully charged. The capacitor voltage 18 varies, for example and without limitation, from about 2.1 VDC to about 1.8 VDC when there is sufficient bus current to fully charge the capacitor 16. There is, for example and without limitation, about 0.2 VDC of hysteresis in the charge switch 20. The voltage regulating circuit 6 provides, for example and without limitation, a regulated 3.6 VDC at any capacitor voltage 18 above, for example and without limitation, about 850 mV.

The voltage regulating circuit 6 can be powered from a battery 80 (shown in phantom line drawing) or from an external AC/DC source 82 (shown in phantom line drawing). An external power jack 84 has a built-in switch 85 that disconnects the battery 80 when the external AC/DC source 82 is connected. This permits usage of, for example, a non-rechargeable lithium battery. The battery 80 is protected from being charged by the voltage regulating circuit 6 by a blocking diode 86.

With the relatively low operating voltage of the voltage regulating circuit 6, a regulated voltage drop of, for example and without limitation, about 1.4 VDC is desired from the capacitor voltage 18, which is provided by the two forward-biased silicon diodes D2A 68, D2B 70. The bootstrap circuit 22 employs a voltage that is regulated, for example and without limitation, 0.7 VDC lower than the capacitor voltage 18.

The main circuit structures that prevent relatively high voltage pulses from passing through to the final VDC output 88 include the transformer 2 and the capacitor 16. The transformer 2 has a relatively very high impedance. It looks like, for example and without limitation, about a 1.5 H inductor (about a 560Ω reactance) in series with about a 750Ω resistor to the charge switch 20. The transformer 2 acts like a relatively weak current source even up to about several hundred volts open-circuit voltage. When the charge switch transistor Q1 52 is on, the circuit voltage is limited to the capacitor voltage 18. The capacitor equivalent series resistance is, for example and without limitation, about a third of one Ω, so it does not move off its terminal voltage 18 much, even with a relatively high transformer voltage. The inductance of coil 10 and the relatively large capacitance of capacitor 16 form an inductor-capacitor filter network to prevent relatively large voltage pulses from passing to the regulator 54. When the charge switch transistor Q1 52 is off, which happens at a capacitor terminal voltage 18 of about 2.1 VDC, the raw DC voltage in front of it can rise to the open-circuit voltage of the transformer coil 10, less the forward voltage drop of the bridge rectifier (not numbered in FIG. 11A). That voltage is limited to a maximum voltage by TVS (transient voltage suppression) protection diodes (not shown) across the terminals (not numbered) of coil 10 to a level below the breakdown threshold voltage that the transistors Q1 52, Q2 58, Q3 60 and Q6 62 can withstand.

Figure 2:
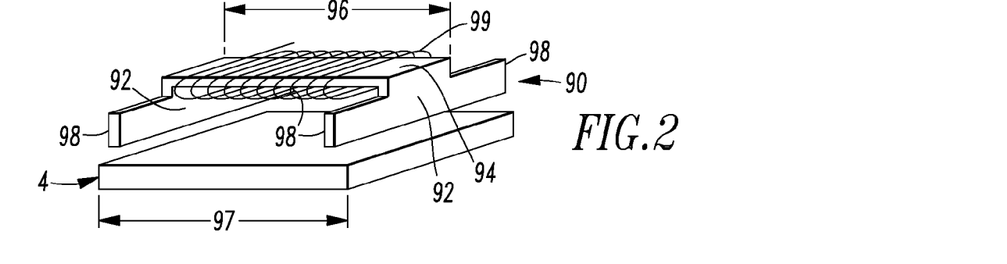
FIGS. 2-7 are isometric views of transformer cores and bus bars in accordance with other embodiments of the disclosed concept.

Referring to FIG. 2, another core 90 is similar to the core 12 of FIGS. 1A-1C except that the relatively wide ends 92 of the core 90 are bent downward (with respect to FIG. 2) toward the bus bar 4 to facilitate the collection of magnetic flux 32 (FIG. 1C). The core 90 is transverse to the current 14 (FIG. 1C) flowing in the bus bar 4, is made from a magnetic low carbon electrical steel or a nickel steel, has a central region 94 and a width 96 about equal to or less than a width 97 of the bus bar 4, and has ends 98 extended in the direction of the current 14 to facilitate collection of the magnetic flux 32. A coil 99 is wound onto the core central region 94.

Figure 3:
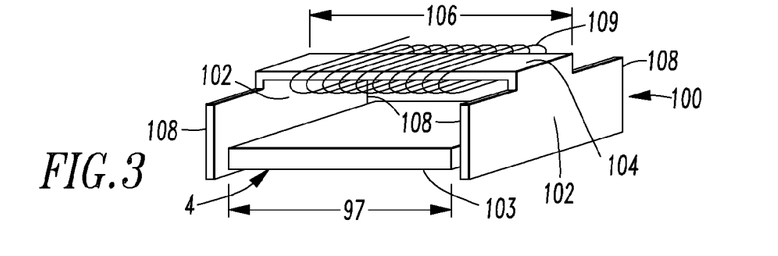

FIG. 3 shows another core 100, which is similar to the core 90 of FIG. 2 except that the core 100 is wider than the bus bar 4, and the relatively wide ends 102 are bent downward (with respect to FIG. 3) below the surface 103 of the bus bar 4. However, this reduces the space around the bus bar 4 which is critical for phase-to-phase isolation. The core 100 is transverse to the current 14 (FIG. 1C) flowing in the bus bar 4, is made from a magnetic low carbon electrical steel or a nickel steel, has a central region 104 and a width 106 greater than the bus bar width 97, and has ends 108 bent toward and extending beyond the bus bar 4 to facilitate collection of magnetic flux 32 (FIG. 1C). A coil 109 is wound onto the core central region 104.

Figure 4:
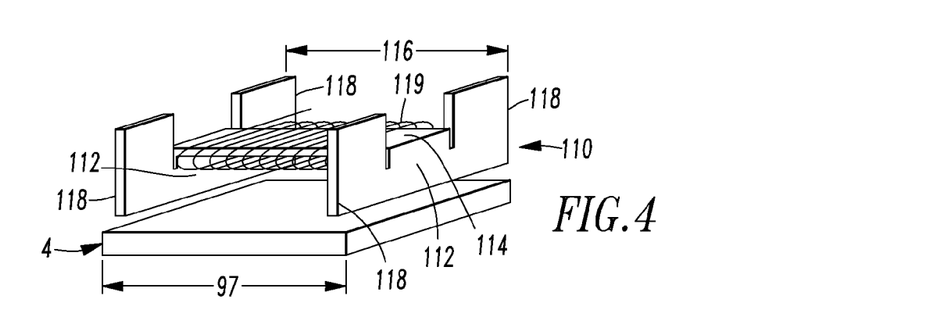

FIG. 4 shows another core 110, which is similar to the core 90 of FIG. 2 except that the relatively wide ends 112 that are bent downward (with respect to FIG. 4) are also extended upward (with respect to FIG. 4). The core 110 is transverse to the current 14 flowing in the bus bar 4, is made from a magnetic low carbon electrical steel or a nickel steel, has a central region 114 and a width 116 about equal to or less than the bus bar width 97, and has ends 118 bent toward the bus bar 4 to facilitate collection of magnetic flux 32 (FIG. 1C). A portion of the ends 118 also extend away from the bus bar 4. A coil 119 is wound onto the core central region of 114.

Figure 5:
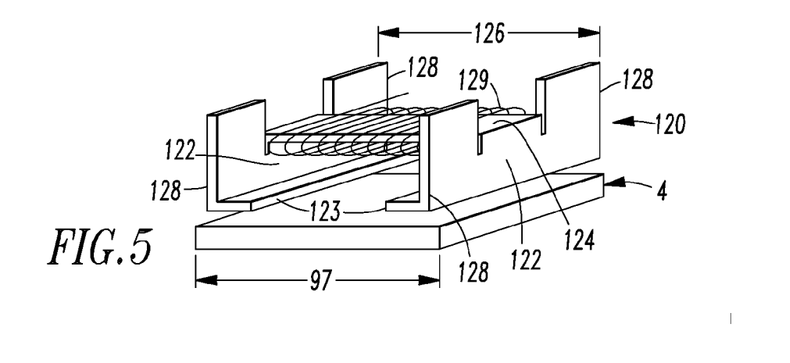

FIG. 5 shows another core 120, which is similar to the core 110 of FIG. 4 except that the relatively wide ends 122 that are bent downward (with respect to FIG. 5) are also extended inward on the bottom 123 (with respect to FIG. 5) thereof. The core 120 is transverse to the current 14 flowing in the bus bar 4, is made from a magnetic low carbon electrical steel or a nickel steel, has a central region 124 and a width 126 about equal to or less than the bus bar width 97, and has ends 128 bent toward the bus bar 4 to facilitate collection of magnetic flux 32 (FIG. 1C). A coil 129 is wound onto the core central region 124. A first portion of a first one of the ends 128 also extends inward toward a second portion of a second one of the ends 128. The second portion of the second one of the ends 128 also extends inward toward the first portion.

Figure 6:
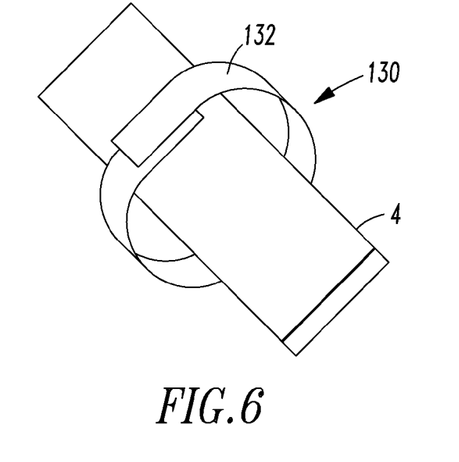

FIG. 6 shows another core configuration 130 that encircles the bus bar 4. This core configuration 130 includes a layer 132 of a relatively thin core material that is wrapped around the bus bar 4. This significantly increases the magnetic flux in the core (not shown) and increases the output power from the coil (not shown). However, this core configuration 130 reduces the space around the bus bar 4 which is critical for phase-to-phase isolation.

Figure 7:
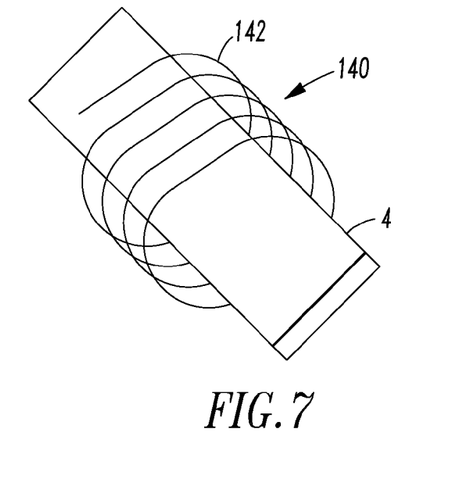

FIG. 7 shows another core configuration 140 that includes a relatively narrow thin layer (e.g., without limitation, a wire 142) of core material that is wrapped around the bus bar 4 a plurality of times. This core configuration 140 is equivalent to wrapping the bus bar 4 around the wire 142, which significantly increases the magnetic flux in the core (not shown) and increases the output power from the coil (not shown). However, this core configuration 140 reduces the space around the bus bar 4 which is critical for phase-to-phase isolation.

The core configurations 100, 130 and 140 of respective FIGS. 3, 6 and 7 are not employed if the transformer 2 should not be wider than the bus bar 4.

Figure 8A:
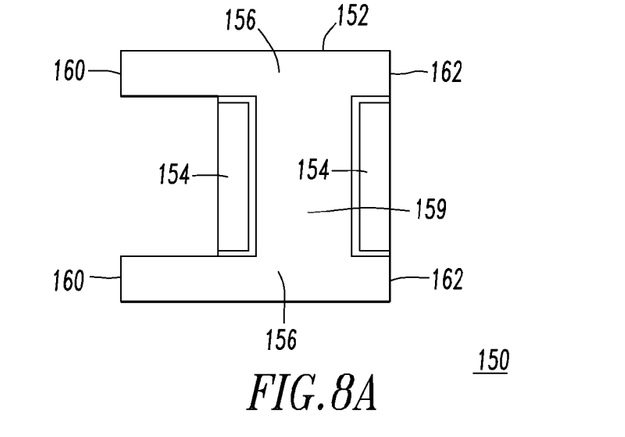
FIG. 8A is a plan view of a transformer in accordance with another embodiment of the disclosed concept.
Figure 8B:
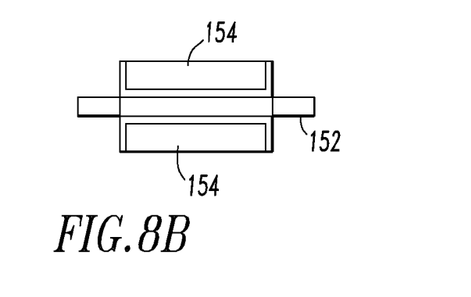
FIG. 8B is a vertical elevation view of the transformer of FIG. 8A.

Referring to FIGS. 8A-8B, another transformer 150 including a core 152 and a coil 154 is shown. The example core 152 includes two elongated parallel members 156 disposed along the length 158 of the bus bar 4 (FIG. 1A) and a cross member 159 disposed normal to the two elongated parallel members 156. The example coil 154 is wound about the cross member 159 and has a single winding (e.g., without limitation, 8000 turns, 40 AWG, 779Ω). In this example, the relatively wide ends 160 of the core 152 are extended relatively far to the left (with respect to FIG. 8A) to facilitate the collection of magnetic flux 32 (FIG. 1C). The relatively wide ends 162 of the core 152 are extended slightly to the right (with respect to FIG. 8A) to accommodate space for other components of the sensor apparatus 210 (FIG. 12). For example, the core 152 is not a symmetrical "H" shape, because there are other components (not shown) in the example sensor apparatus 210 that need to be in the center of the structure (e.g., without limitation, an acoustic sensor; a mounting screw/bolt).

Figure 9A:
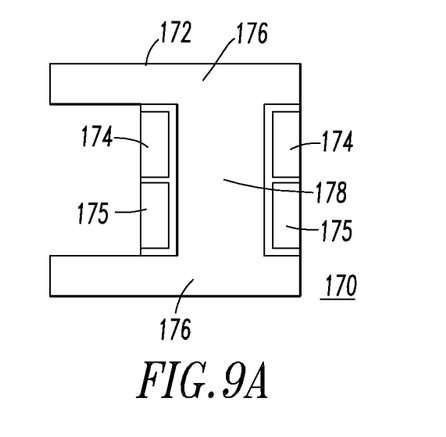
FIG. 9A is a plan view of a transformer in accordance with another embodiment of the disclosed concept.
Figure 9B:
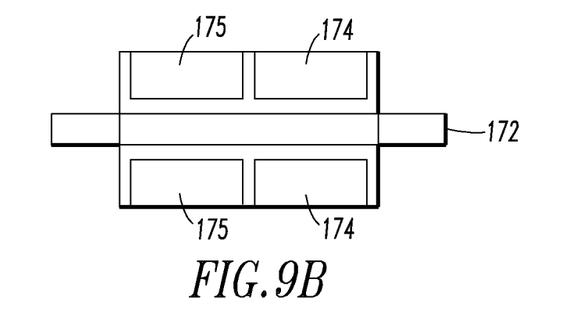
FIG. 9B is a vertical elevation view of the transformer of FIG. 9A.
Figure 9C:
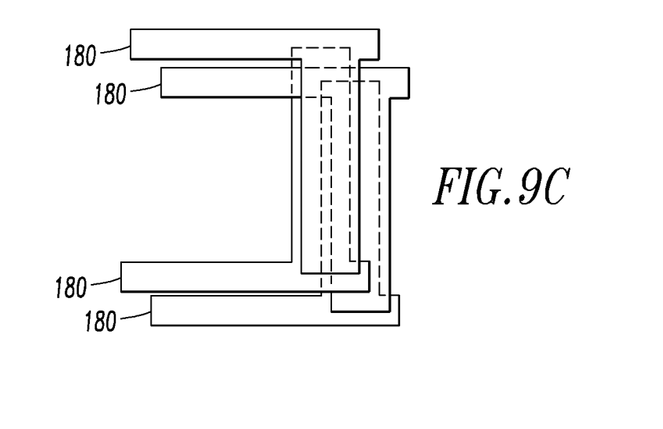
FIG. 9C is a plan view of plural laminations of the transformer core of FIG. 9A.

FIGS. 9A-9C show another transformer 170 including a core 172 and two coils 174,175. The example core 172 includes two elongated parallel members 176 disposed along the length 158 of the bus bar 4 (FIG. 1A) and a cross member 178 disposed normal to the two elongated parallel members 176. The example coils 174,175 are wound about the cross member 178 and have two windings. The two elongated parallel members 176 are formed by a plurality of L-shaped laminations 180. The example L-shaped laminations 180 (FIG. 9C) (e.g., without limitation, four laminations of 0.025" thick M-22) facilitate assembly. The core laminations 180 can slide into the coils 174,175 alternately from each end thereof (e.g., four lamination layers alternatively flipped up or down).

Figure 10A:
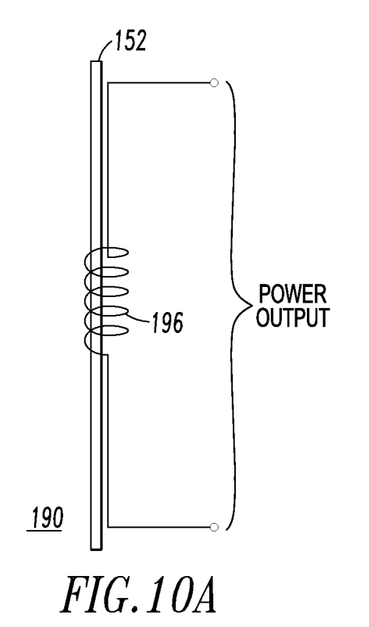
FIGS. 10A-10C are simplified views of transformer cores and windings in accordance with other embodiments of the disclosed concept.
Figure 10B:
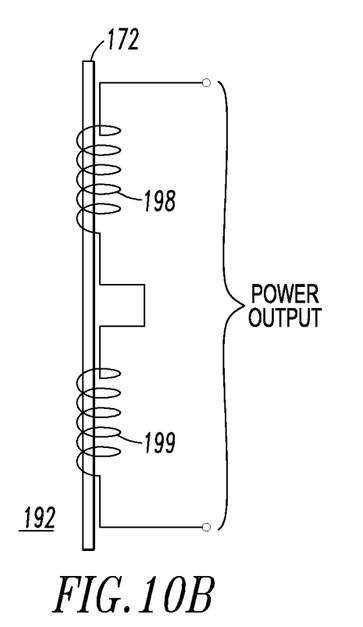
Figure 10C:
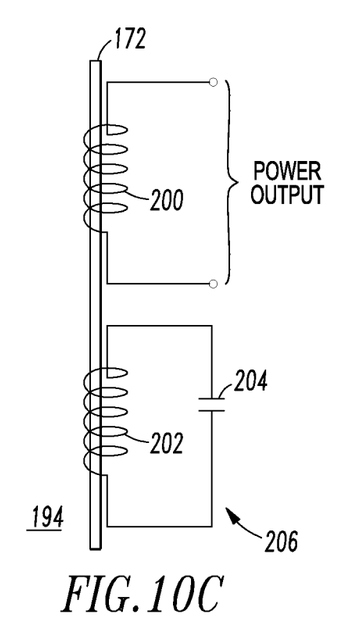

FIGS. 10A-10C show various transformer cores 190,192, 194. At relatively high bus bar currents, the transformer core magnetically saturates, and the open circuit output voltage from the transformer coil becomes highly distorted, resulting in relatively large voltage spikes that can damage the corresponding electronic circuit 30 (FIG. 12). Therefore, suitable voltage regulation is employed.

Two types of voltage attenuation will be described: a resonating tank circuit (FIG. 10C), and a multiple winding circuit (FIG. 10B). When the transformer core saturates, the output energy is concentrated into a relatively smaller time interval, which distorts the output voltage, and results in relatively large output voltage spikes. The peak output voltage becomes relatively higher in magnitude as the transformer core becomes relatively more saturated. An open circuit coil produces a maximum output voltage because there is no current.

A shorted coil produces a minimum output voltage because the resulting coil current reduces the flux in the core. The coil can be made with one winding 196 (FIG. 10A for FIGS. 8A-8B) or with multiple windings 198,199 or 200,202 (FIGS. 10B-10C for FIGS. 9A-9B). Multiple windings 198,199 electrically connected in series (FIG. 10B) behave as a single winding. However, each of the multiple windings 198,199 can be more easily isolated from each other to prevent close proximity of the first turns with the last turns, where dielectric breakdown can occur during the high voltage spikes.

The core 194 of FIG. 10C includes a first winding 200 and a separate and distinct second winding 202. The first winding 200 is electrically interconnected with the voltage regulating circuit 6 (FIGS. 11A-11B). The second winding 202 is electrically connected to a capacitor 204 to form a resonant inductor-capacitor tank circuit 206, which is structured to resonate at the frequency of the bus bar 4 current 14 (FIG. 1A). The first winding 200 provides power to the sensor 28 (FIG. 12) and/or the corresponding electronic circuit 30 (FIG. 12). The value of the capacitor 204 is selected relative to the inductance of the second winding 202, to resonate at the frequency of the current 14 (FIG. 1C) in the bus bar 4 (e.g., without limitation, 50 or 60 Hz). When the transformer core material saturates at relatively high bus bar currents (e.g., short circuit currents), the tank circuit 206 causes the output energy to be spread out over the period of resonance, which provides attenuation of the output voltage from the first winding 200.

Referring to FIG. 12, a sensor apparatus 210 includes a housing 212, a clamp 213 or a fastener 214 structured to clamp or fasten together the housing 212 and an electrical power conductor 216, a parasitic power supply 218 formed by the voltage regulating circuit 6 of FIGS. 11A-11B and one of the transformers of FIGS. 1A-1C, 2-7, 8A-8B, FIGS. 9A-9C and/or FIGS. 10A-10C, the sensor 28 structured to sense a characteristic 222 (e.g., without limitation, an acoustic signal or signature) of the electrical power conductor 216 and output a signal 224, and a circuit 226 powered by the power supply 218 and structured to output information 228 (e.g., without limitation, an electrical conductivity fault) related to the sensed characteristic 222 from the signal 224.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A parasitic power supply for an electrical power conductor for outputting a desired voltage to an electronic device coupled to said power supply, said power supply comprising:
   a transformer comprising a coil disposed on a core structured to be disposed parallel to said electrical power conductor, said coil having a voltage induced by current flowing in said electrical power conductor, and
   a voltage regulating circuit cooperating with said transformer, said voltage regulating circuit comprising:
      a capacitor having a voltage,
      a charge switch structured to charge said capacitor from the voltage of said coil,
      a bootstrap circuit downstream of the coil, the bootstrap circuit being structured to enable said charge switch to charge said capacitor responsive to the voltage of said capacitor being below a first predetermined value and above a second predetermined value and responsive to the voltage of said capacitor being below a third predetermined level but, not when the voltage of said capacitor is below the second predetermined value and above the third predetermined value, wherein the first predetermined value is greater than the second predetermined value and the second predetermined value is greater than the third predetermined value,
      a charge controller structured to: (i) disable and lock out the bootstrap circuit responsive to the voltage of said capacitor being above the third predetermined value, and (ii) enable said charge switch to charge said capacitor by turning on a drive current to the charge switch responsive to the voltage of said capacitor being below the second predetermined value and above the third predetermined value, and
      a voltage regulator downstream of said capacitor, said charge switch, said bootstrap circuit, and said charge controller and powered by the voltage of said capacitor, wherein an output of said voltage regulator is said desired voltage output to said electronic device.

2. The power supply of claim 1 wherein each of said charge switch, said bootstrap circuit and said charge controller is either on or off.

3. The power supply of claim 1 wherein said capacitor is a supercapacitor.

4. The power supply of claim 1 wherein the voltage of said coil has a maximum voltage; and wherein said charge switch comprises a plurality of transistors having a breakdown threshold voltage greater than the maximum voltage of the voltage of said coil.

5. The power supply of claim 1 wherein said coil and said capacitor form an inductor-capacitor filter network for said voltage regulator.

6. The power supply of claim 1 wherein said charge controller is a voltage sensitive switch that turns on at about said second predetermined value to turn on the drive current to said charge switch.

7. The power supply of claim 1 wherein said charge controller comprises a transistor and a resistor providing hysteresis for said charge switch.

8. The power supply of claim 1 wherein said voltage regulator comprises said output having a direct current voltage.

9. The power supply of claim 8 wherein said voltage regulator further comprises an input receiving the voltage of said capacitor, and wherein the voltage of said capacitor is an asymmetric triangle wave having an up-slope, which is a function of charging current available from said transformer, and a down-slope, which is a function of load current supplied by said direct current output.

10. The power supply of claim 1 wherein said core is transverse to the current flowing in said electrical power conductor, is made from a magnetic low carbon electrical steel or a nickel steel, has a central region and a width about equal to or less than a width of said electrical power conductor, and has ends extended in the direction of said current to facilitate collection of magnetic flux; and wherein said coil is wound onto the central region of said core.

11. The power supply of claim 1 wherein said core is transverse to the current flowing in said electrical power conductor, is made from a magnetic low carbon electrical steel or a nickel steel, has a central region and a width about equal to or less than a width of said electrical power conductor, and has ends bent toward said electrical power conductor to facilitate collection of magnetic flux; and wherein said coil is wound onto the central region of said core.

12. The power supply of claim 1 wherein said core is transverse to the current flowing in said electrical power conductor, is made from a magnetic low carbon electrical steel or a nickel steel, has a central region and a width greater than a width of said electrical power conductor, and has ends bent toward and extending beyond said electrical power conductor to facilitate collection of magnetic flux; and wherein said coil is wound onto the central region of said core.

13. The power supply of claim 1 wherein said core is transverse to the current flowing in said electrical power conductor, is made from a magnetic low carbon electrical steel or a nickel steel, has a central region and a width about equal to or less than a width of said electrical power conductor, and has ends bent toward said electrical power conductor to facilitate collection of magnetic flux; wherein a portion of said ends also extend away from said electrical power conductor; and wherein said coil is wound onto the central region of said core.

14. The power supply of claim 13 wherein a first portion of a first one of said ends also extends inward toward a second portion of a second one of said ends; and wherein the second portion of the second one of said ends also extends inward toward said first portion.

15. The power supply of claim 1 wherein a portion of said core is wrapped around said electrical power conductor.

16. The power supply of claim 1 wherein said core comprises a layer of core material wrapped around said electrical power conductor a plurality of times.

17. The power supply of claim 1 wherein said electrical power conductor has a length; and wherein said core comprises two elongated parallel members disposed along the length of said electrical power conductor and a cross member disposed normal to said two elongated parallel members; said coil being wound about said cross member.

18. The power supply of claim 17 wherein said two elongated parallel members are formed by a plurality of L-shaped laminations.

19. The power supply of claim 1 wherein said core comprises a single winding.

20. The power supply of claim 1 wherein said core comprises a plurality of windings electrically connected in series.

21. The power supply of claim 1 wherein said core comprises a first winding and a separate and distinct second winding; wherein said first winding is electrically interconnected with said voltage regulating circuit; and wherein said second winding is electrically connected to a capacitor to form a resonant tank circuit, which is structured to resonate at a frequency of said current flowing in said electrical power conductor.

\* \* \* \* \*